US009257410B2

(12) United States Patent
Wu et al.

(10) Patent No.: US 9,257,410 B2
(45) Date of Patent: Feb. 9, 2016

(54) PACKAGE ASSEMBLY INCLUDING A SEMICONDUCTOR SUBSTRATE IN WHICH A FIRST PORTION OF A SURFACE OF THE SEMICONDUCTOR SUBSTRATE IS RECESSED RELATIVE TO A SECOND PORTION OF THE SURFACE OF THE SEMICONDUCTOR SUBSTRATE TO FORM A RECESSED REGION IN THE SEMICONDUCTOR SUBSTRATE

(75) Inventors: Albert Wu, Palo Alto, CA (US); Roawen Chen, Monte Sereno, CA (US); Chung Chyung Han, San Jose, CA (US); Shiann-Ming Liou, Campbell, CA (US); Chien-Chuan Wei, Los Gatos, CA (US); Runzi Chang, San Jose, CA (US); Scott Wu, San Jose, CA (US); Chuan-Cheng Cheng, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 17 days.

(21) Appl. No.: 13/012,644

(22) Filed: Jan. 24, 2011

(65) Prior Publication Data
US 2011/0186998 A1 Aug. 4, 2011

Related U.S. Application Data

(60) Provisional application No. 61/301,125, filed on Feb. 3, 2010, provisional application No. 61/316,282, filed on Mar. 22, 2010, provisional application No. 61/321,068, filed on Apr. 5, 2010, provisional application No. 61/325,189, filed on Apr. 16, 2010.

(51) Int. Cl.
*H01L 25/04* (2014.01)
*H01L 21/48* (2006.01)
(Continued)

(52) U.S. Cl.
CPC .............. *H01L 25/04* (2013.01); *H01L 21/486* (2013.01); *H01L 23/13* (2013.01); *H01L 23/147* (2013.01);
(Continued)

(58) Field of Classification Search
CPC ..................... H01L 21/486; H01L 225/06541; H01L 225/06548; H01L 23/49827; H01L 25/0657
USPC .................. 257/698, 738, 774, 778, E23.011, 257/E23.023; 438/108
See application file for complete search history.

(56) References Cited

U.S. PATENT DOCUMENTS 5,239,198 A    8/1993   Lin et al.
5,291,062 A *  3/1994   Higgins, III .................. 257/698
(Continued)

FOREIGN PATENT DOCUMENTS

CN    1538520 A    10/2004
CN    101208789 A   6/2008
(Continued)

OTHER PUBLICATIONS

Merriam-Webster online dictionary, Definition of Unitary, retrieved on Feb. 18, 2015, www.merriam-webster.com/dictionary/unitary.*
(Continued)

*Primary Examiner* — Tucker J Wright

(57) ABSTRACT

Embodiments of the present disclosure provide an apparatus comprising a semiconductor substrate having a first surface, a second surface that is disposed opposite to the first surface, wherein at least a portion of the first surface is recessed to form a recessed region of the semiconductor substrate, and one or more vias formed in the recessed region of the semiconductor substrate to provide an electrical or thermal pathway between the first surface and the second surface of the semiconductor substrate, and a die coupled to the semiconductor substrate, the die being electrically coupled to the one or more vias formed in the recessed region of the semiconductor substrate. Other embodiments may be described and/or claimed.

26 Claims, 10 Drawing Sheets

(51) Int. Cl.
  *H01L 23/13* (2006.01)
  *H01L 23/14* (2006.01)
  *H01L 23/498* (2006.01)
  *H01L 25/065* (2006.01)
  *H01L 25/10* (2006.01)
  *H01L 25/00* (2006.01)
  *H01L 23/367* (2006.01)
  *H01L 23/00* (2006.01)

(52) U.S. Cl.
  CPC ...... *H01L 23/49827* (2013.01); *H01L 25/0652* (2013.01); *H01L 25/0657* (2013.01); *H01L 25/105* (2013.01); *H01L 25/50* (2013.01); *H01L 23/3677* (2013.01); *H01L 24/16* (2013.01); *H01L 24/48* (2013.01); *H01L 2224/16225* (2013.01); *H01L 2224/16235* (2013.01); *H01L 2224/32225* (2013.01); *H01L 2224/48227* (2013.01); *H01L 2224/73265* (2013.01); *H01L 2225/06517* (2013.01); *H01L 2225/06527* (2013.01); *H01L 2225/06541* (2013.01); *H01L 2225/1023* (2013.01); *H01L 2225/1058* (2013.01); *H01L 2924/01078* (2013.01); *H01L 2924/01079* (2013.01); *H01L 2924/12044* (2013.01); *H01L 2924/14* (2013.01); *H01L 2924/1515* (2013.01); *H01L 2924/1532* (2013.01); *H01L 2924/15153* (2013.01); *H01L 2924/15159* (2013.01); *H01L 2924/15311* (2013.01); *H01L 2924/15331* (2013.01); *H01L 2924/19042* (2013.01); *H01L 2924/19043* (2013.01)

(56) References Cited

U.S. PATENT DOCUMENTS

| | | | |
|---|---|---|---|
| 5,659,203 A | | 8/1997 | Call et al. |
| 5,793,117 A | | 8/1998 | Shimada et al. |
| 5,977,640 A | | 11/1999 | Bertin et al. |
| 6,222,246 B1 * | 4/2001 | Mak et al. | 257/532 |
| 6,285,559 B1 * | 9/2001 | Fukiharu | 361/760 |
| 6,356,453 B1 | | 3/2002 | Juskey et al. |
| 6,359,790 B1 | | 3/2002 | Meyer-Berg |
| 6,753,205 B2 * | 6/2004 | Halahan | 438/107 |
| 6,984,544 B2 | | 1/2006 | Cloud et al. |
| 7,268,012 B2 | | 9/2007 | Jiang et al. |
| 7,741,194 B2 | | 6/2010 | Griffiths |
| 7,777,351 B1 | | 8/2010 | Berry et al. |
| 7,808,075 B1 | | 10/2010 | Cheng et al. |
| 7,816,183 B2 | | 10/2010 | Kawata |
| 7,851,259 B2 | | 12/2010 | Kim |
| 7,858,441 B2 | | 12/2010 | Lin et al. |
| 8,704,350 B2 | | 4/2014 | Park et al. |
| 2001/0019853 A1 | | 9/2001 | Kroner |
| 2002/0006686 A1 | | 1/2002 | Cloud et al. |
| 2003/0160325 A1 | | 8/2003 | Yoneda et al. |
| 2003/0192176 A1 | | 10/2003 | Eldridge et al. |
| 2004/0178491 A1 | | 9/2004 | Akram et al. |
| 2005/0121686 A1 | | 6/2005 | Keller et al. |
| 2007/0035008 A1 | | 2/2007 | Wu et al. |
| 2008/0017968 A1 | | 1/2008 | Choi et al. |
| 2008/0117607 A1 | | 5/2008 | Murayama et al. |
| 2008/0197491 A1 | | 8/2008 | Matsui |
| 2008/0315433 A1 | | 12/2008 | Chen et al. |
| 2009/0101897 A1 | | 4/2009 | Murphy et al. |
| 2009/0243100 A1 | | 10/2009 | Akiyama |
| 2009/0283899 A1 | | 11/2009 | Yoon et al. |
| 2009/0302485 A1 | | 12/2009 | Fan |
| 2010/0148336 A1 | | 6/2010 | Do et al. |
| 2010/0164079 A1 | | 7/2010 | Dekker et al. |
| 2010/0171205 A1 | | 7/2010 | Chen et al. |
| 2015/0221577 A1 | | 8/2015 | Liou et al. |

FOREIGN PATENT DOCUMENTS

| | | |
|---|---|---|
| CN | 101252118 A | 8/2008 |
| DE | 102005014049 A1 | 12/2006 |
| TW | I249231 | 2/2006 |
| TW | 200625562 A1 | 7/2006 |
| TW | 200839983 A | 10/2008 |
| TW | 200933838 A | 8/2009 |
| TW | 201003994 A | 1/2010 |
| WO | WO2007/115371 | 10/2007 |
| WO | WO2009070348 A1 | 4/2009 |
| WO | WO2010045187 | 4/2010 |

OTHER PUBLICATIONS

PCT Search Report mailed Feb. 5, 2013 for PCT application No. PCT/US12/59530, 10 pages.

International Preliminary Report on Patentability and Written Opinion for PCT Application No. PCT/US2010/061630 dated Aug. 2, 2012, 7 pgs.

* cited by examiner

PACKAGE ASSEMBLY INCLUDING A SEMICONDUCTOR SUBSTRATE IN WHICH A FIRST PORTION OF A SURFACE OF THE SEMICONDUCTOR SUBSTRATE IS RECESSED RELATIVE TO A SECOND PORTION OF THE SURFACE OF THE SEMICONDUCTOR SUBSTRATE TO FORM A RECESSED REGION IN THE SEMICONDUCTOR SUBSTRATE

CROSS REFERENCE TO RELATED APPLICATIONS

This disclosure claims priority to U.S. Provisional Patent Application No. 61/301,125, filed Feb. 3, 2010, and to U.S. Provisional Patent Application No. 61/316,282, filed Mar. 22, 2010, and to U.S. Provisional Patent Application No. 61/321,068, filed Apr. 5, 2010, and to U.S. Provisional Patent Application No. 61/325,189, filed Apr. 16, 2010, the entire specifications of which are hereby incorporated by reference in their entirety for all purposes, except for those sections, if any, that are inconsistent with this specification.

TECHNICAL FIELD

Embodiments of the present disclosure relate to the field of integrated circuits, and more particularly, to techniques, structures, and configurations of recessed semiconductor substrates for package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on dies or chips that continue to scale in size to smaller dimensions. The shrinking dimensions of the dies are challenging conventional substrate fabrication and/or package assembly technologies that are currently used to route electrical signals to or from the semiconductor die. For example, laminate substrate technologies may not produce sufficiently small features on a substrate to correspond with the finer pitches of interconnects or other signal-routing features formed on the dies.

SUMMARY

In one embodiment, the present disclosure provides an apparatus comprising a semiconductor substrate having a first surface, a second surface that is disposed opposite to the first surface, wherein at least a portion of the first surface is recessed to form a recessed region of the semiconductor substrate, and one or more vias formed in the recessed region of the semiconductor substrate to provide an electrical or thermal pathway between the first surface and the second surface of the semiconductor substrate, and a die coupled to the semiconductor substrate, the die being electrically coupled to the one or more vias formed in the recessed region of the semiconductor substrate.

In another embodiment, the present disclosure provides a method comprising providing a semiconductor substrate having (i) a first surface, and (ii) a second surface that is disposed opposite to the first surface, recessing at least a portion of the first surface to form a recessed region of the semiconductor substrate, forming one or more vias in the recessed region of the semiconductor substrate to provide an electrical or thermal pathway between the first surface and the second surface of the semiconductor substrate, and coupling a die to the semiconductor substrate, the die being electrically coupled to the one or more vias formed in the recessed region of the semiconductor substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations for a semiconductor substrate having a recessed region and associated package assemblies.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
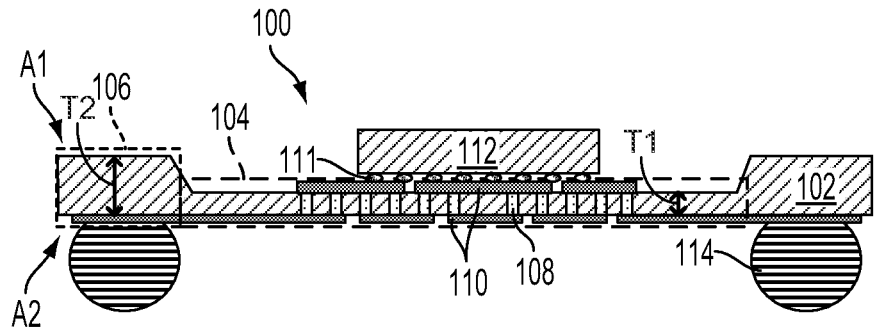
FIGS. 1-19 schematically illustrate configurations for various example package assemblies that include a semiconductor substrate having a recessed region.

FIGS. 1-19 schematically illustrate various example package assemblies that include a semiconductor substrate 102 having a recessed region (e.g., a portion of the semiconductor substrate 102 that is disposed within region 104, hereinafter referred to as the recessed region 104). FIG. 1 depicts a configuration for a package assembly 100, in accordance with various embodiments. The package assembly 100 includes a semiconductor substrate 102, which is a substrate or interposer that substantially comprises a semiconductor material such as, for example, silicon (Si). That is, the bulk of the material of the semiconductor substrate 102 is a semiconductor material. The semiconductor material can include crystalline and/or amorphous types of material. In the case of silicon, for example, the silicon can include single crystal and/or polysilicon types. In other embodiments, the semiconductor substrate 102 can include other semiconductor materials such as, for example, germanium, group III-V materials, or group II-VI materials, that may also benefit from the principles described herein.

The semiconductor substrate 102 includes a first surface, A1, and a second surface, A2, that is disposed opposite to the first surface A1. The first surface A1 and the second surface A2 generally refer to opposing surfaces of the semiconductor substrate 102 to facilitate the description of various configurations described herein.

According to various embodiments, a portion of the first surface A1 is recessed relative to other portions of the first surface A1 to form the recessed region 104 of the semiconductor substrate 102. The recessed region 104 generally provides a relatively thinner area of the semiconductor substrate 102 to facilitate the formation of one or more vias 108 through the semiconductor substrate 102. In some embodiments, the semiconductor substrate 102 is recessed such that the recessed region 104 has a thickness, T1, between about 10 microns and about 500 microns.

The semiconductor substrate 102 of FIG. 1 includes a region 106 of the semiconductor substrate 102 that is external to and thicker than the recessed region 104, hereinafter referred to as thicker region 106. A thickness, T2, of the semiconductor substrate 102 within the thicker region 106 is greater than the thickness T1 of the recessed region 104.

The semiconductor substrate 102 is fabricated using technologies similar to those that are generally known to fabricate integrated circuit (IC) structures on a die or chip. For example, well-known patterning processes such as lithography/etch and/or deposition processes for fabricating IC devices on a die can be used to form features of the semiconductor substrate 102. By using semiconductor fabrication techniques, the semiconductor substrate 102 can include smaller features than other types of substrates such as laminate (e.g., organic) substrates. The semiconductor substrate 102 facilitates routing of electrical signals, such as input/output (I/O) and/or power/ground signals, for current dies, which continue to shrink in size. For example, in some embodiments, the semiconductor substrate 102 allows for fine pitch Si-to-Si interconnects and final line routing between the semiconductor substrate 102 and one or more dies 112.

According to various embodiments, one or more vias 108 are formed in the recessed region 104 of the semiconductor substrate 102. The one or more vias 108 are filled with a material that is electrically and/or thermally conductive such as a metal. A dielectric material may be disposed between the metal of the one or more vias and the semiconductor material of the semiconductor substrate. The one or more vias 108 generally provide an electrical or thermal pathway between the first surface A1 and the second surface A2 of the semiconductor substrate 102. In an embodiment where the semiconductor substrate 102 comprises silicon, the one or more vias 108 are one or more through-silicon vias (TSVs).

One or more redistribution layers 110 can be formed on the first surface A1 and/or the second surface A2 of the semiconductor substrate 102 to route the electrical signals of the one or more dies 112 that are coupled to the semiconductor substrate 102. For example, the one or more redistribution layers 110 can provide electrical routing between the one or more dies 112 and the one or more vias 108 and between the one or more vias 108 and one or more package interconnect structures 114.

The one or more redistribution layers 110 can be formed, for example, by forming a dielectric layer comprising, for example, silicon dioxide ($SiO_2$), silicon nitride (SiN), silicon oxynitride ($SiO_xN_y$), or other suitable dielectric materials on a surface of the semiconductor substrate 102 and depositing and/or patterning an electrically conductive material such as, for example, a metal (e.g., copper or aluminum) or a doped semiconductor material (e.g., doped polysilicon) on the dielectric layer. Other suitable electrically conductive materials can be used to form the one or more redistribution layers 110 in other embodiments.

The one or more redistribution layers 110 can include a variety of structures to route the electrical signals such as, for example, pads, lands, or traces. Although not depicted, a passivation layer comprising an electrically insulative material such as polyimide, for example, can be deposited on the one or more redistribution layers 110 and patterned to provide openings in the passivation layer to allow electrical coupling of the one or more dies 112 to the one or more redistribution layers 110.

One or more dies 112 are coupled to the semiconductor substrate 102 using any suitable configuration including, for example, a flip-chip configuration, as depicted. Other suitable die-attach configurations such as, for example, a wire-bonding configuration can be used in other embodiments. In the depicted embodiment of FIG. 1, the one or more dies 112 are coupled to the first surface A1 of the recessed region 104 of the semiconductor substrate 102.

The one or more dies 112 generally comprise a semiconductor material, such as, for example, silicon. In an embodiment, the one or more dies 112 and the semiconductor substrate 102 are fabricated using the same semiconductor material to reduce stress associated with heating/cooling mismatch of materials such as, for example, mismatched coefficients of thermal expansion (CTE).

The one or more dies 112 generally have an active side that includes a surface upon which a plurality of integrated circuit (IC) devices (not shown) such as transistors for logic and/or memory are formed and an inactive side that is disposed opposite to the active side. The active side of the one or more dies 112 is electrically coupled to the one or more redistribution layers 110. In some embodiments, the active side of the one or more dies 112 is coupled to the one or more redistribution layers 110 using one or more bumps 111, as can be seen. In other embodiments, the active side of the one or more dies 112 is electrically coupled to the one or more redistribution layers 110 using other structures, such as, for example, one or more bonding wires.

In the depicted embodiment of FIG. 1, one or more bumps 111 are formed on the one or more dies 112 and bonded to the one or more redistribution layers 110. The one or more bumps 111 generally comprise an electrically conductive material such as, for example, solder or other metal to route the electrical signals of the one or more dies 112. According to various embodiments, the one or more bumps 111 comprise lead, gold, tin, copper, or lead-free materials, or combinations thereof. The one or more bumps 111 can have a variety of shapes including spherical, cylindrical, rectangular, or other shapes and can be formed using a bumping process, such as, for example, a controlled collapse chip connect (C4) process, stud-bumping, or other suitable process.

The one or more bumps 111 can be formed on the one or more dies 112 while the one or more dies 112 are in either wafer or singulated form. The one or more dies 112 can be attached to the semiconductor substrate 102 while the semiconductor substrate 102 is in either wafer or singulated form.

Although not shown, one or more other active or passive components can be mounted on the semiconductor substrate 102. The components can include Electronic Compounds and integrated circuits (ICs). The components can include, for example, filter components, resistors, inductors, power amplifiers, capacitors, or packaged ICs. Other active or passive components can be coupled to the semiconductor substrate 102 in other embodiments.

One or more package interconnect structures 114 such as, for example, one or more solder balls, metal posts, or bumps can be formed on the one or more redistribution layers 110 to further route the electrical signals of the one or more dies 112. In the depicted embodiment of FIG. 1, the one or more package interconnect structures 114 are coupled to one or more redistribution layers 110 formed on the second surface A2 of the semiconductor substrate 102. The one or more package interconnect structures 114 generally comprise an electrically conductive material. The one or more package interconnect structures 114 can be formed in a variety of shapes including spherical, planar, or polygon shapes and can be positioned in a variety of positions including in a row or in an array of multiple rows. Although the one or more package interconnect structures 114 are depicted on a peripheral portion of the semiconductor substrate 102, the one or more package interconnect structures 114 can be disposed on or near a central portion of the semiconductor substrate 102 in other embodiments.

Figure 2:
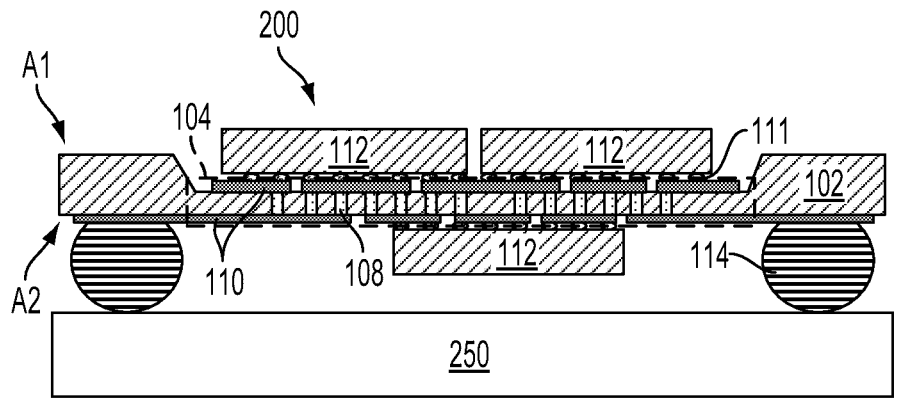

FIG. 2 depicts another configuration for a package assembly 200, in accordance with various embodiments. The package assembly 200 has one or more dies 112 coupled to opposing surfaces of the semiconductor substrate 102. The one or more dies 112 are coupled to the one or more redistribution layers 110 on both the first surface A1 of the semiconductor substrate 102 and the second surface A2 of the semiconductor substrate. The package assembly 200 allows for two-sided coupling of the one or more dies 112 to the semiconductor substrate 102. In the depicted embodiment of FIG. 2, the one or more dies 112 on the first surface A1 are coupled to the same recessed region 104 of the semiconductor substrate 102.

The package assembly 200 can be electrically coupled to another electronic device 250 such as a printed circuit board (PCB) (e.g., motherboard), a module, or another package assembly using the one or more package interconnect structures 114 disposed on the second surface A2 of the semiconductor substrate 102 to further route the electrical signals of the one or more semiconductor dies 112 to the other electronic device 250.

Figure 3:
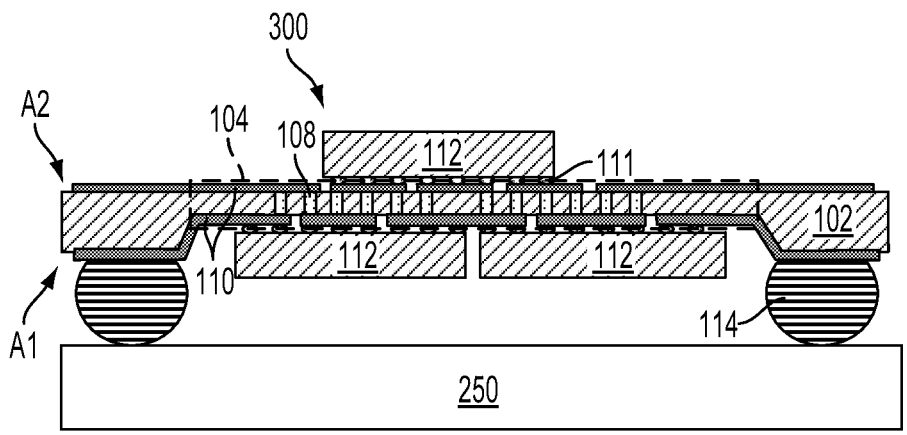

FIG. 3 depicts another configuration for a package assembly 300, in accordance with various embodiments. The package assembly 300 has one or more package interconnect structures 114 formed on the first surface A1 of the semiconductor substrate 102 to electrically couple the semiconductor substrate 102 to another electronic device 250. That is, the one or more package interconnect structures 114 can be coupled to the same surface (e.g., the first surface A1 in FIG. 3) that is recessed to form the recessed region 104.

Figure 4:
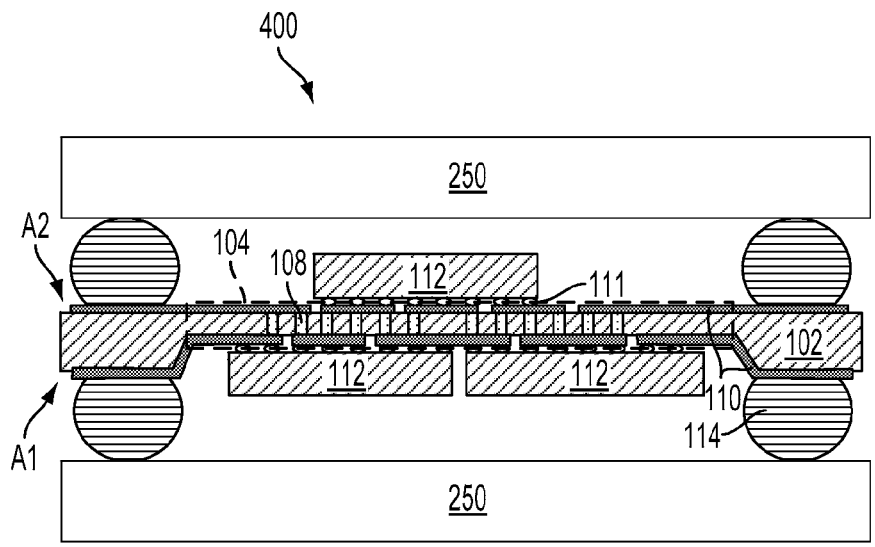

FIG. 4 depicts another configuration for a package assembly 400, in accordance with various embodiments. The package assembly 400 has one or more package interconnect structures 114 disposed on both the first surface A1 and the second surface A2 of the semiconductor substrate 102. The package assembly 400 allows another electronic device 250 to be coupled to the first surface A1 using the one or more package interconnect structures 114 disposed on the first surface A1 and another electronic device 250 to be coupled to the second surface A2 using the one or more package interconnect structures 114 disposed on the second surface A2. For example, in one embodiment, the other electronic device 250 that is coupled to the first surface A1 is a printed circuit board and the other electronic device 250 that is coupled to the second surface A2 is another package assembly. The package assembly 400 can be configured in a variety of multi-stack package-on-package (POP) or other three dimensional (3D) packaging configurations.

Figure 5:
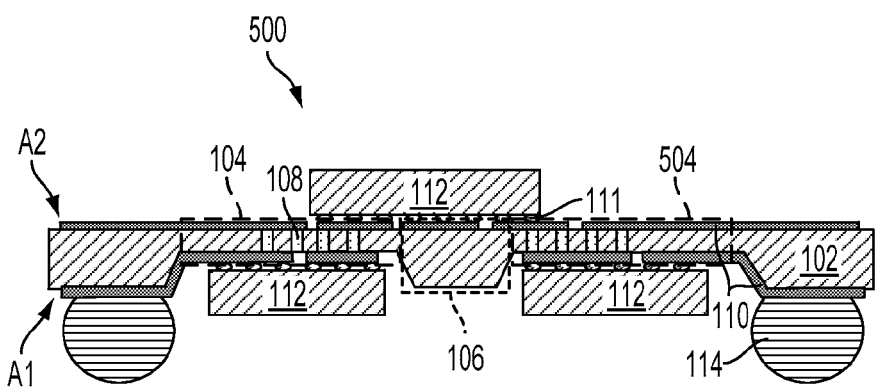

FIG. 5 depicts another configuration for a package assembly 500, in accordance with various embodiments. The package assembly 500 has a recessed region 104, which is a first recessed region, and at least another recessed region 504, which is a second recessed region, formed in the first surface A1 of the semiconductor substrate 102. The recessed region 104 can be formed by recessing a first portion of the first surface A1 and the other recessed region 504 can be formed by recessing a second portion of the first surface A1. The recessed region 104 and the other recessed region 504 are separated by a thicker region 106 of the semiconductor substrate 102. The thicker region 106 provides stronger mechanical support for the package assembly 500, including during fabrication, packaging and/or assembly operations.

In the depicted embodiment, the one or more vias 108 are formed in both the recessed region 104 and the other recessed region 504 and at least one die of the one or more dies 112 is disposed in each of recessed region 104 and the other recessed region 504. Additional recessed regions can be used in other embodiments.

Figure 6:
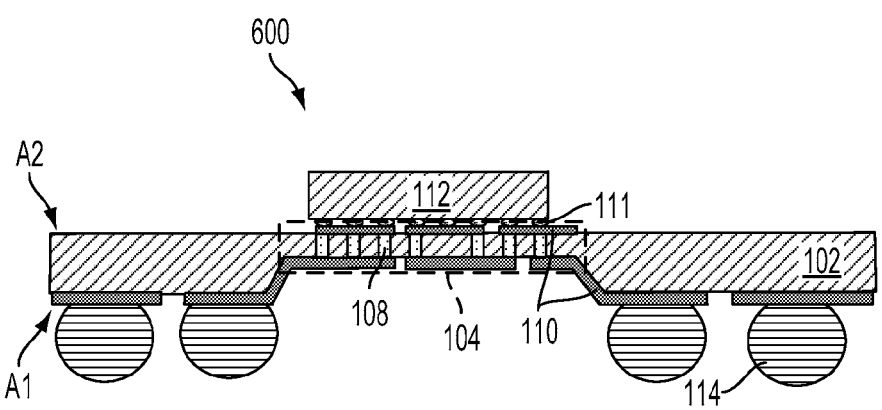

FIG. 6 depicts another configuration for a package assembly 600, in accordance with various embodiments. The semiconductor substrate 102 of the package assembly 600 has a recessed first surface A1 to form recessed region 104. One or more dies 112 are disposed on the second surface A2 of the semiconductor substrate 102. In the depicted embodiment, the one or more dies 112 are coupled to the second surface A2 of the recessed region 104 of the semiconductor substrate 102, which is substantially planar relative to the first surface A1. The one or more package interconnect structures 114 can be arranged in a variety of configurations including a ball-grid array (BGA) configuration.

Figure 7:
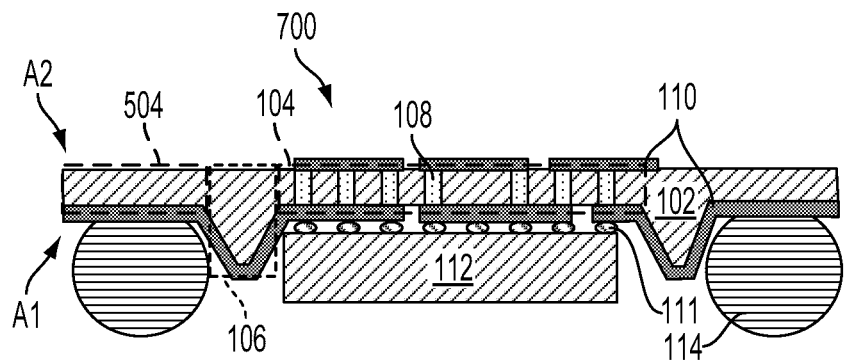

FIG. 7 depicts another configuration for a package assembly 700, in accordance with various embodiments. The package assembly 700 has a recessed region 104, which is a first recessed region, and at least another recessed region 504, which is a second recessed region, formed in the first surface A1 of the semiconductor substrate 102. The recessed region 104 and the other recessed region 504 are separated by a thicker region 106 of the semiconductor substrate 102.

One or more dies 112 are coupled to the first surface A1 of the recessed region 104 and one or more package interconnect structures 114 are coupled to the first surface A1 of the other recessed region 504. The package assembly 700 having the one or more package interconnect structures 114 coupled to the other recessed region 504, as can be seen, provides a thinner package assembly 700 than a package assembly having one or more package interconnect structures coupled to a thicker region (e.g., the thicker region 106). In the depicted embodiment, the one or more package interconnect structures 114 are electrically coupled to the one or more dies 112 using one or more redistribution layers 110 formed on the first surface A1 of the semiconductor substrate 102.

Figure 8:
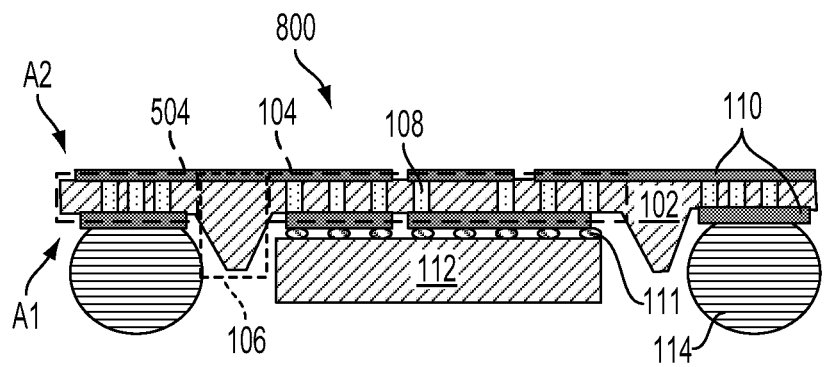

FIG. 8 depicts another configuration for a package assembly 800, in accordance with various embodiments. The package assembly 800 includes a recessed region 104, another recessed region 504, and a thicker region 106 similar to the package assembly 700 of FIG. 7. The package assembly 800 further includes one or more vias 108 formed in the other recessed region 504 to electrically couple the one or more package interconnect structures 114 to the one or more dies 112. The one or more vias 108 that are disposed in the other recessed region 504 are electrically coupled to the one or more dies 112 through at least the one or more redistribution layers 110 formed on the second surface A2 and the one or more vias 108 that are disposed in the recessed region 104, as can be seen.

Figure 9:
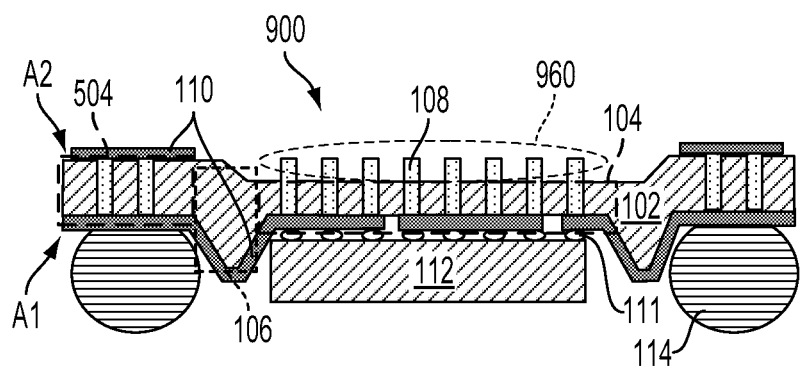

FIG. 9 depicts another configuration for a package assembly 900, in accordance with various embodiments. The package assembly 900 includes a recessed region 104, another recessed region 504, and thicker region 106 similar to those described in connection with FIGS. 7 and 8. In FIG. 9, at least a portion of the second surface A2 of the semiconductor substrate 102 is recessed to expose the one or more vias 108 disposed in the recessed region 104 such that the one or more vias 108 extend beyond the recessed portion of the second surface A2, defining an extended portion 960 of the one or more vias 108. The extended portion 960 of the one or more vias 108 can function as one or more fins of a heat sink to facilitate heat removal away from the one or more dies 112.

Figure 10:
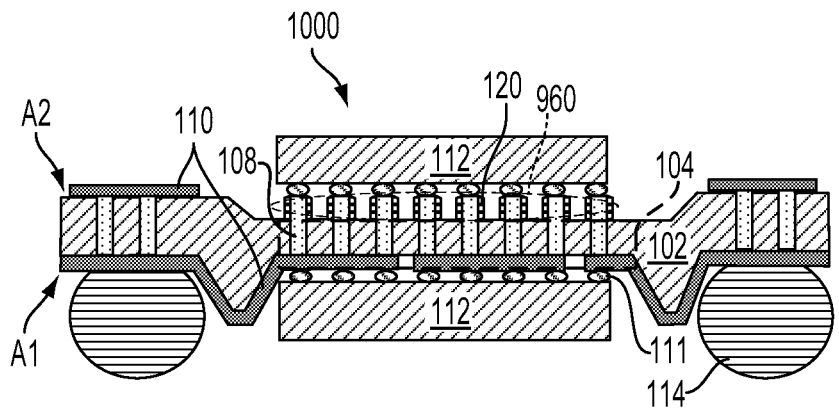

FIG. 10 depicts another configuration for a package assembly 1000, in accordance with various embodiments. The package assembly 1000 includes an extended portion 960 of the one or more vias 108 formed by recessing at least a portion of the second surface A2 of the semiconductor substrate 102. A dielectric liner 120 or film, including, for example, an oxide, is disposed on the electrically and/or thermally conductive material of the one or more vias 108. The dielectric liner 120 can, for example, serve as a protection layer to protect the electrically and/or thermally conductive material of the one or more vias 108 from a process (e.g., etch) that recesses the second surface A2 of the semiconductor substrate to expose the one or more vias 108. One or more dies 112 can be electrically coupled to the extended portion 960 of the one or more vias 108 using one or more bumps 111, as can be seen.

Figure 11:
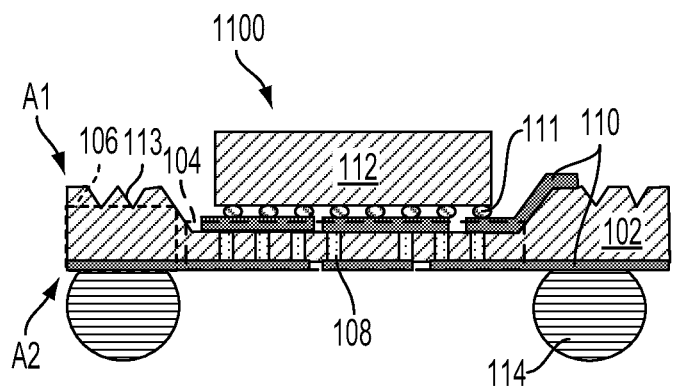

FIG. 11 depicts another configuration for a package assembly 1100, in accordance with various embodiments. The package assembly 1100 includes a recessed region 104 and a thicker region 106, as can be seen. One or more selectively recessed areas 113, such as holes or channels, are formed on a surface of the thicker region 106 to increase surface area of the semiconductor substrate 102 and, thus, facilitate heat dissipation away from heat sources of the package assembly 1100.

Figure 12:
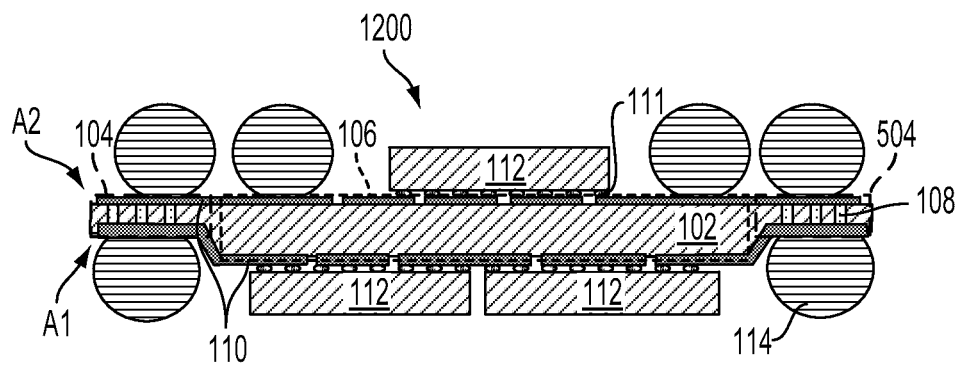

FIG. 12 depicts another configuration for a package assembly 1200, in accordance with various embodiments. The package assembly 1200 includes a recessed region 104, another recessed region 504, and a thicker region 106 disposed between the recessed region 104 and the other recessed region 504, as can be seen. One or more vias 108 are formed in the recessed region 104 and the other recessed region 504. At least one package interconnect structure of the one or more package interconnect structures 114 is disposed on the first surface A1 of the recessed region 104 and the other recessed region 504. Such configuration may reduce a total height or thickness of the package assembly 1200. One or more dies 112 are coupled to the first surface A1 and/or the second surface A2 of the thicker region 106, as can be seen.

Figure 13:
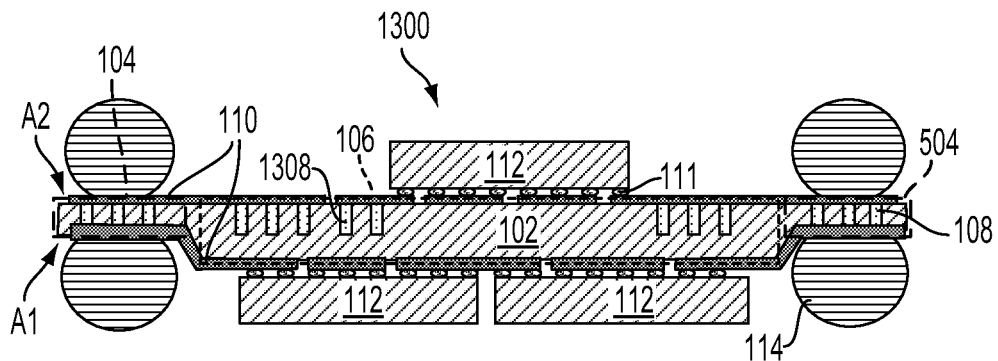

FIG. 13 depicts another configuration for a package assembly 1300, in accordance with various embodiments. The package assembly 1300 includes one or more vias 108 that pass completely through the semiconductor substrate 102. That is, the one or more vias 108 are formed in the recessed region 104 and the other recessed region 504 to form a continuous electrical or thermal connection between the first surface A1 and the second surface A2 of the semiconductor substrate 102. One or more additional vias 1308 are formed in the second surface A2 of the thicker region 106 of the semiconductor substrate 102. The one or more additional vias 1308 do not pass completely through the semiconductor substrate 102. That is, the one or more additional vias 1308 are disposed on only the second surface A2 of the semiconductor substrate 102 and do not reach the first surface A1 in the depicted embodiment. The one or more additional vias 1308 provide finger structures that facilitate heat removal by providing a thermal pathway for heat in the package assembly 1300.

Figure 14:
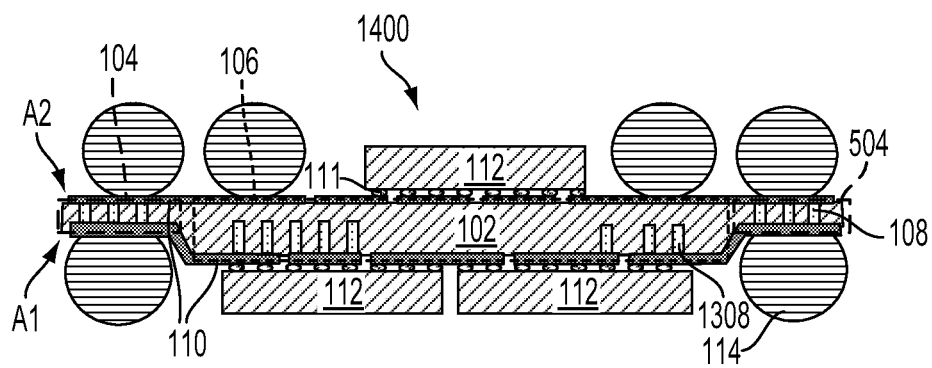

FIG. 14 depicts another configuration for a package assembly 1400, in accordance with various embodiments. The package assembly 1400 includes one or more additional vias 1308 formed in the first surface A1 of the thicker region 106 of the semiconductor substrate 102. The one or more additional vias 1308 do not pass completely through the semiconductor substrate 102. That is, the one or more additional vias 1308 are disposed on only the first surface A1 of the semiconductor substrate 102 and do not reach the second surface A2 in the depicted embodiment. The one or more additional vias 1308 provide finger structures that facilitate heat removal by providing a thermal pathway for heat in the package assembly 1400.

Figure 15:
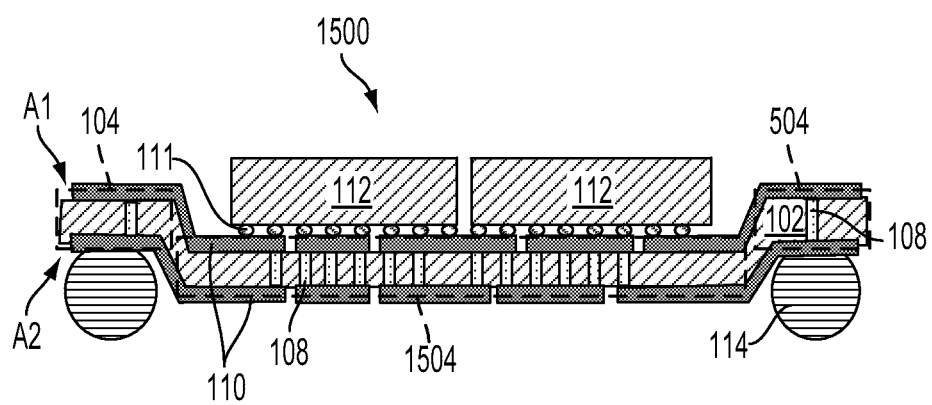

FIG. 15 depicts another configuration for a package assembly 1500, in accordance with various embodiments. The package assembly 1500 includes a recessed region 104 and another recessed region 504 formed in a second surface A2 of the semiconductor substrate 102, as can be seen. An additional recessed region 1504 is formed by recessing at least a portion of the first surface A1 of the semiconductor substrate 102, as can be seen. One or more vias 108 are disposed in the recessed region 104, the other recessed region 504, and the additional recessed region 1504, as can be seen. One or more package interconnect structures 114 are disposed on the second surface A2 of the recessed region 104 and the other recessed region 504. One or more dies 112 are disposed on the first surface A1 of the additional recessed region 1504. Such configuration provides a package assembly 1500 having a reduced height or thickness.

Figure 16:
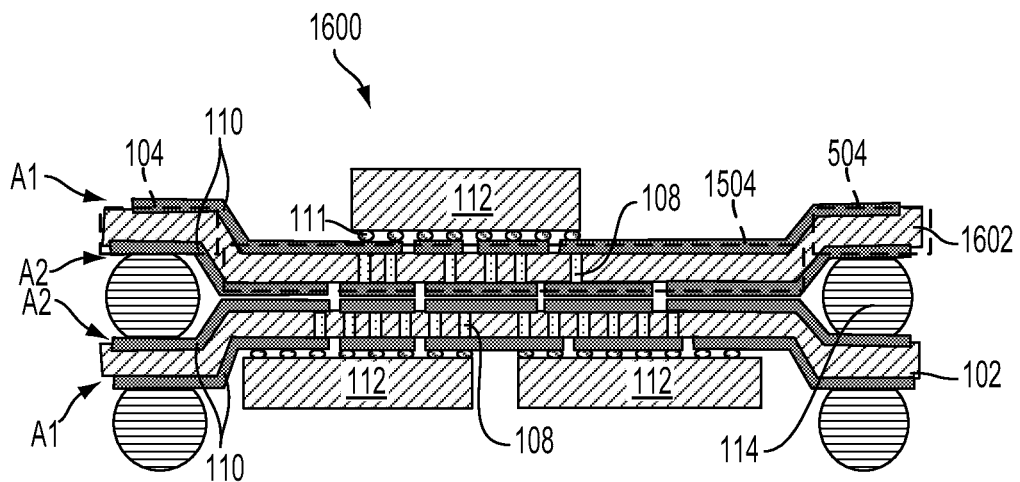

FIG. 16 depicts another configuration for a package assembly 1600, in accordance with various embodiments. The package assembly 1600 includes a semiconductor substrate 102 that is configured in a similar fashion as the semiconductor substrate 102 of package assembly 1500 of FIG. 15. The package assembly 1600 further includes another semiconductor substrate 1602 stacked on the semiconductor substrate 102, as can be seen. The other semiconductor substrate 1602 includes a recessed region 104 and another recessed region 504 formed in the second surface A2 of the other semiconductor substrate 1602, as can be seen. An additional recessed region 1504 is formed in the first surface A1 of the other semiconductor substrate 1602, as can be seen. One or more vias 108 are formed in the additional recessed region 1504 and one or more semiconductor dies 112 are electrically coupled to the one or more vias 108 disposed in the additional recessed region 1504.

According to various embodiments, the second surface A2 of the semiconductor substrate 102 is coupled to the second surface A2 of the other semiconductor substrate 1602. The semiconductor substrate 102 and the other semiconductor substrate 1602 can be coupled, for example, using one or more package interconnect structures 114, as can be seen. Other types of electrical or structural connections can be made between the semiconductor substrate 102 and the other semiconductor substrate 1602 in other embodiments.

Figure 17:
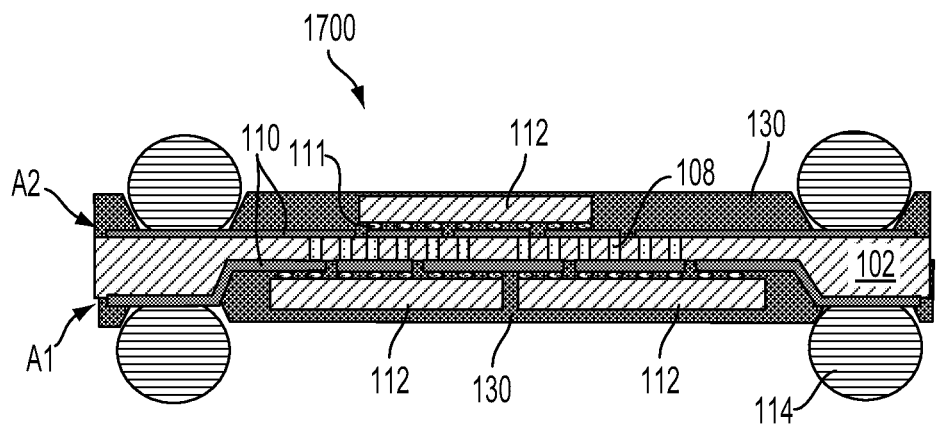

FIG. 17 depicts another configuration for a package assembly 1700, in accordance with various embodiments. The package assembly 1700 includes a semiconductor substrate 102 that is configured in a similar fashion as the semiconductor substrate 102 of the package assembly 400 of FIG. 4. The package assembly 1700 further includes a molding compound 130 disposed on the first surface A1 and/or the second surface A2 of the semiconductor substrate 102. In some embodiments, the molding compound 130 is disposed to substantially encapsulate the one or more semiconductor dies 112. The molding compound 130 generally protects the one or more semiconductor dies 112 from moisture, oxidation, or chipping associated with handling.

The molding compound 130 can be used in conjunction with an underfill material (not shown), in some embodiments. For example, the underfill material may be disposed between the one or more dies 112 and the semiconductor substrate 102 to encapsulate the one or more bumps 111 and the molding compound 130 can be disposed to encapsulate the one or more dies 112. In some embodiments, the molding compound 130 can be formed such that a surface of the one or more dies 112 is exposed to facilitate heat dissipation from the one or more dies 112. The molding compound 130 can be selected to have a coefficient of thermal expansion that is substantially the same or similar to a coefficient of thermal expansion of the semiconductor substrate 102 and/or the one or more dies 112.

Figure 18:
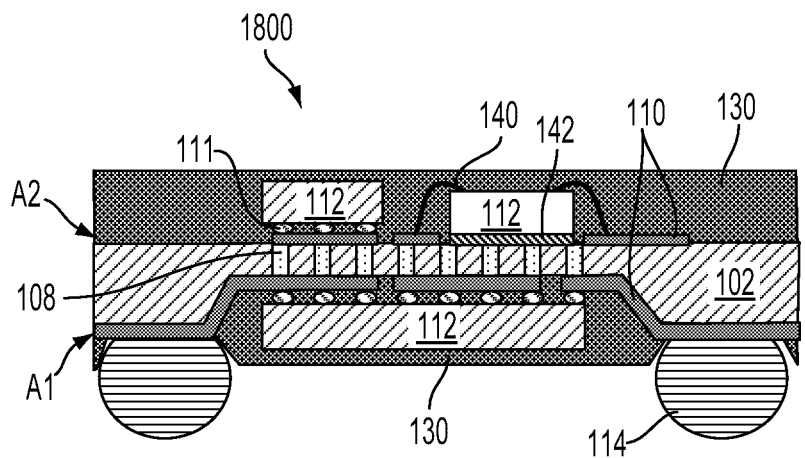

FIG. 18 depicts another configuration for a package assembly 1800, in accordance with various embodiments. The package assembly 1800 includes one or more dies 112 coupled to the semiconductor substrate 102. A die of the one or more dies 112 is coupled to the semiconductor substrate using an adhesive 142 to attach an inactive surface of the die to the second surface A2 of the semiconductor substrate, as can be seen. One or more bonding wires 140 electrically couple an active surface of the die to the one or more redistribution layers 110, as can be seen.

A molding compound 130 is disposed to substantially encapsulate the one or more dies 112 and the one or more bonding wires 140, as can be seen. Other combinations of flip-chip and wire-bonding configurations or only wire-bonding configurations can be used in various embodiments.

Figure 19:
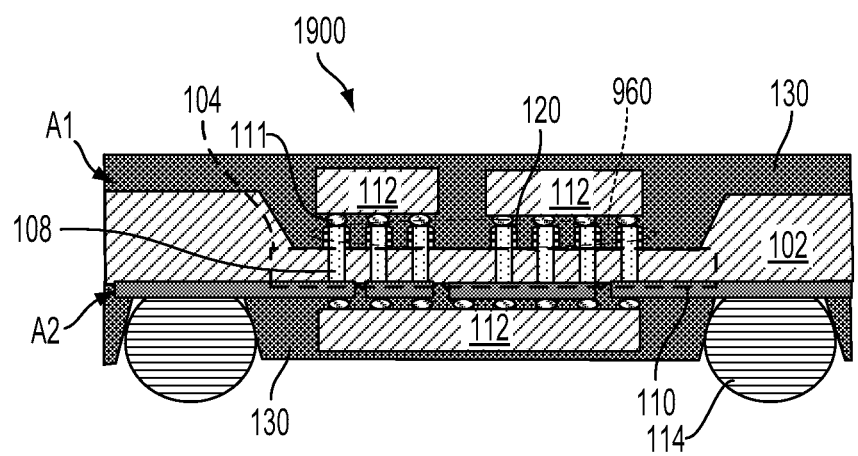

FIG. 19 depicts another configuration for a package assembly 1900, in accordance with various embodiments. The semiconductor substrate 102 includes a recessed region 104 formed in the first surface A1 and one or more vias 108 formed in the recessed region 104. The first surface A1 is recessed to expose an extended portion 960 of the one or more vias 108. A dielectric liner 120 is disposed on the electrically and/or thermally conductive material of the one or more vias 108, as can be seen. One or more dies 112 are coupled to the extended portion 960 of the one or more vias 108, as can be seen. A molding compound 130 is disposed to substantially encapsulate the one or more dies 112 and to fill a region between the one or more semiconductor dies and the semiconductor substrate 102, as can be seen.

Configurations for package assemblies that use semiconductor substrates as described herein can provide benefits of reducing process complexity and/or cost associated with fabricating one or more vias in a semiconductor substrate, enabling two-side utilizations of the semiconductor substrate, facilitating multi-stack package configurations, reducing a size of a package assembly, and/or increasing thermal dissipation. The present disclosure includes within its scope any suitable combinations of embodiments described in connection with FIGS. 1-19.

Figure 20:
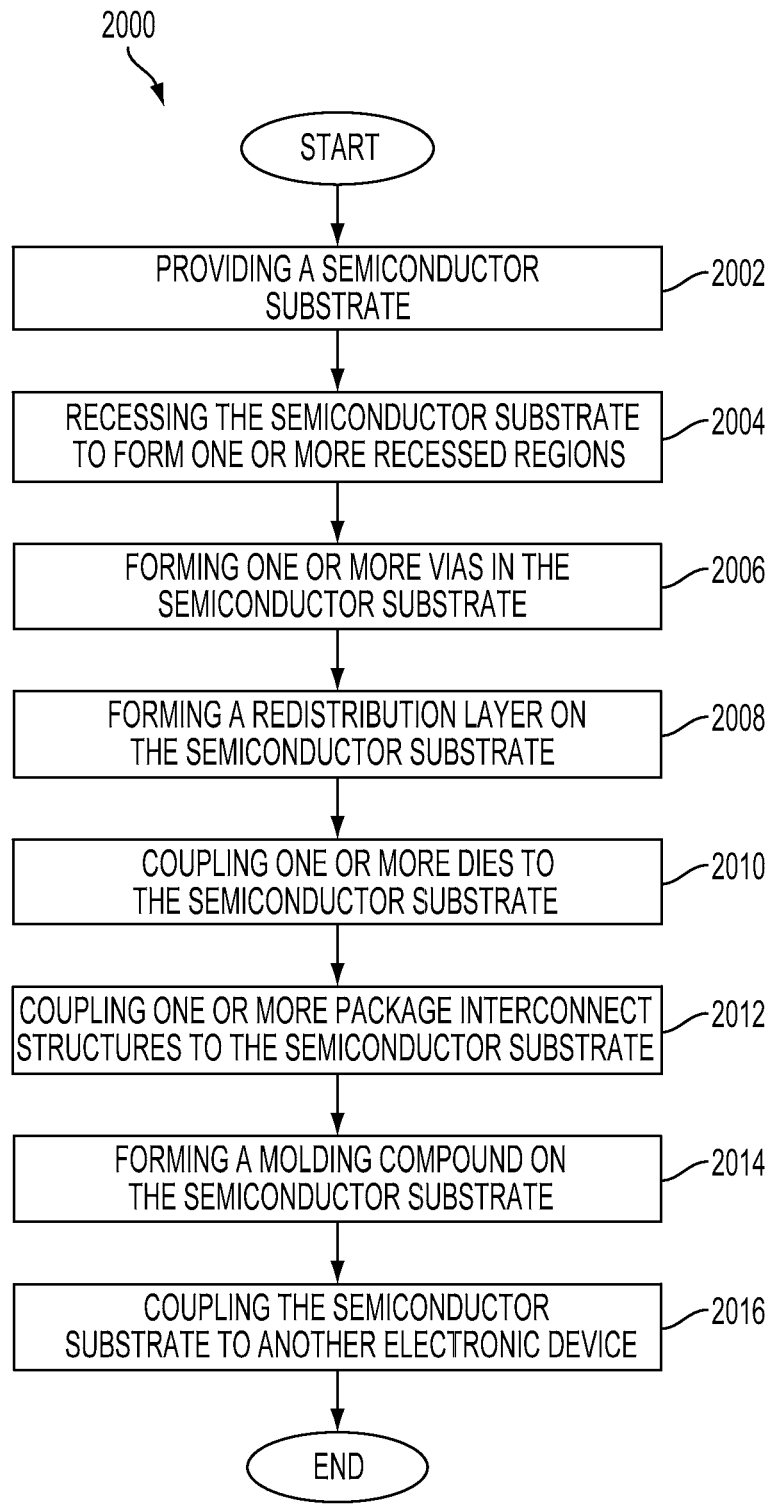
FIG. 20 is a process flow diagram of a method to fabricate a package assembly that includes a semiconductor substrate having a recessed region.

FIG. 20 is a process flow diagram of a method 2000 to fabricate a package assembly (e.g., the package assembly 100 of FIG. 1) that includes a semiconductor substrate (e.g., the semiconductor substrate 102 of FIG. 1.) having a recessed region (e.g., the recessed region 104 of FIG. 1). At 2002, the method 2000 includes providing a semiconductor substrate. The semiconductor substrate has a first surface (e.g., the first surface A1 of FIG. 1) and a second surface (e.g., the second surface A2 of FIG. 1) that is disposed opposite to the first surface. The semiconductor substrate comprises a semiconductor material such as, for example, silicon. The semiconductor substrate can be cut, for example, from an ingot of monocrystalline or polycrystalline semiconductor material. The semiconductor substrate can be in singulated or in wafer form during processing described in connection with method 2000.

At 2004, the method 2000 further includes recessing the semiconductor substrate to form one or more recessed regions (e.g., the recessed region 104 of FIG. 1). At least a portion of a surface of the semiconductor substrate is recessed to remove semiconductor material from the semiconductor substrate and provide a recessed region that is thinner to facilitate the formation of one or more vias through the recessed region. The surface of the semiconductor substrate can be recessed using any suitable process including well-known etch processes such as, for example, silicon wet etch processes.

In some embodiments, only a portion of the first surface is recessed. In other embodiments, portions of the first surface and/or the second surface are recessed to provide package assembly configurations having multiple recessed regions as described herein. According to various embodiments, the recessed region(s) has a thickness that is smaller than a thickness of a region (e.g., thicker region 106 of FIG. 1) of the semiconductor substrate that is external to the recessed region(s).

At 2006, the method 2000 further includes forming one or more vias (e.g., the one or more vias 108 of FIG. 1) in the semiconductor substrate. The one or more vias are generally formed in the recessed region(s) to provide an electrical and/or thermal pathway between the first surface and the second surface of the semiconductor substrate. According to various embodiments, the one or more vias comprise through-silicon vias (TSVs).

The one or more vias are generally formed by removing semiconductor material from the recessed region to form one or more channels through the semiconductor substrate. A variety of suitable processes can be used to form the one or more channels including laser-drilling and/or etch processes that remove semiconductor material from the recessed region. The recessed region can facilitate the formation of the one or more vias by providing a thickness of semiconductor material that allows drilling or etching of one or more vias completely through the semiconductor substrate. Although the vias can be formed by removing material from the first side or the second side of the semiconductor substrate, the via formation process may be facilitated by removing material from the surface that is more planar or flat (e.g., the second surface A2 of FIG. 1).

Subsequent to the one or more channels being formed, a dielectric film can be formed on a surface of the one or more channels. The dielectric film can be formed by using a deposition technique such as, for example, physical vapor deposition (PVD), chemical vapor deposition (CVD), and/or atomic layer deposition (ALD) to deposit a dielectric material such as, for example, silicon dioxide ($SiO_2$), silicon nitride (SiN), or silicon oxynitride ($SiO_xN_y$), where x and y represent suitable stoichiometric values. Other suitable deposition techniques and/or dielectric materials can be used in other embodiments. The dielectric film generally provides electrical isolation for electrically conductive material disposed in the one or more vias to prevent current leakage between the electrically conductive material and the semiconductor material (e.g., silicon) of the semiconductor substrate.

An electrically and/or thermally conductive material such as, for example, copper or another metal is deposited into the one or more channels. In one embodiment, the electrically and/or thermally conductive material is deposited to substantially fill the one or more channels. In another embodiment, the electrically and/or thermally conductive material is deposited to coat the dielectric film on the surfaces of the one or more channels and an electrically insulative material such as, for example, an epoxy, resin, or oxide is deposited to fill a remaining portion of the one or more channels.

The one or more vias can be used to route electrical signals of one or more dies coupled to the semiconductor substrate. In some embodiments, one or more vias (e.g., the one or more additional vias 1308 of FIG. 13) are formed in a thicker region (e.g., the thicker region 106 of FIG. 13) of the semiconductor substrate to facilitate heat dissipation. Such vias are generally disposed on only one of the first surface and the second surface of the semiconductor substrate. That is, the one or more vias formed in the thicker region do not pass completely through the semiconductor substrate.

In some embodiments, a surface of the semiconductor substrate is recessed subsequent to formation of the one or more vias to provide an extended portion (e.g., the extended portion 960 of FIG. 9) of the one or more vias that extends beyond the recessed surface of the semiconductor substrate. The dielectric film (e.g., the dielectric liner 120 of FIG. 10) disposed on the surface of the one or more channels of the one or more vias can protect the electrically and/or thermally conductive material of the one or more vias against an etch process used to expose the extended portion. Another etch process, such as a spacer etch process, can be used to remove a portion of the dielectric film to facilitate coupling of one or more dies to the electrically and/or thermally conductive material of the one or more vias.

At 2008, the method 2000 further includes forming a redistribution layer (e.g., the one or more redistribution layers 110 of FIG. 1) on the semiconductor substrate. The redistribution layer is generally formed by depositing a dielectric film on a surface of the semiconductor substrate and depositing an electrically conductive material on the dielectric film. In some embodiments, the dielectric film is deposited simultaneously with the deposition of the dielectric film to form the one or more vias. The deposited electrically conductive material can be patterned and/or etched to provide routing structures of the redistribution layer that route electrical signals of one or more dies. Multiple redistribution layers can be stacked on the first surface and/or the second surface of the semiconductor substrate to provide desired routing of the electrical signals.

At 2010, the method 2000 further includes coupling one or more dies to the semiconductor substrate. The one or more dies can be coupled to the semiconductor substrate in a variety of configurations including, for example, flip-chip or wire-bonding configurations, or combinations thereof. In a flip-chip configuration, an active surface of the die is coupled to the redistribution layer using one or more bumps (e.g., the one or more bumps 111 of FIG. 1). In a wire-bonding configuration, an inactive surface of the die is coupled to the semiconductor substrate using an adhesive (e.g., the adhesive 142 of FIG. 18) and an active surface of the die is coupled to the redistribution layer using one or more bonding wires 140. The one or more dies are electrically coupled to the one or more vias formed in the recessed region(s) of the semiconductor substrate.

The one or more dies can be coupled to the first surface and/or the second surface of the semiconductor substrate. Further, the one or more dies can be coupled to the recessed region(s) or thicker region(s) of the semiconductor substrate, according to various embodiments.

At 2012, the method 2000 further includes coupling one or more package interconnect structures (e.g., the one or more package interconnect structures 114 of FIG. 1) to the semiconductor substrate. The one or more package interconnect structures can be formed by a variety of suitable processes including, for example, by screen printing, electrical plating, placement, or other well-known methods. The one or more package interconnect structures are electrically coupled to the redistribution layer(s) on one or both of the first surface and the second surface of the semiconductor substrate to route the electrical signals of the one or more dies to or from the package assembly to another electronic device (e.g., the other electronic device 250 of FIG. 2).

At 2014, the method 2000 further includes forming a molding compound (e.g., the molding compound 130 of FIG. 17) on the semiconductor substrate. The molding compound can be formed on one or both of the first surface and the second surface of the semiconductor substrate. The molding compound is generally disposed to encapsulate the one or more dies. According to various embodiments, the molding compound is formed by depositing a resin (e.g., a thermosetting resin) in solid form (e.g., a powder) into a mold and applying heat and/or pressure to fuse the resin. Other well-known techniques for forming the molding compound can be used in other embodiments.

In some embodiments, the molding compound is formed subsequent to the one or more package interconnect structures being coupled to the semiconductor substrate. In such a case, the molding compound can be formed to provide electrical access to the one or more package interconnect structures. For example, the molding compound can be deposited such that the molding compound does not fully encapsulate the one or more package interconnect structures. In another example, openings can be formed in the molding compound by, e.g., an etch or laser process, to expose the one or more package interconnect structures for electrical access where the one or more package interconnect structures function as an etch/laser stop material. In another example, the molding compound can be polished or otherwise recessed to expose the one or more package interconnect structures.

In other embodiments, the molding compound is formed prior to the one or more package interconnect structures being coupled to the semiconductor substrate. In such a case, the molding compound can be selectively formed such that the molding compound does not cover an area of the redistribution layer where the one or more package interconnect structures are to be coupled. In another example, one or more openings can be formed in the molding compound using, for example, a laser or etch process to expose the redistribution layer and the one or more package interconnect structures can be formed in the openings.

At 2016, the method 2000 further includes coupling the semiconductor substrate to another electronic device (e.g., the other electronic device 250 of FIG. 2). The semiconductor substrate is electrically coupled to another electronic device, such as, for example, a printed circuit board or another semiconductor substrate or interposer, using the one or more package interconnect structures. The semiconductor substrate can be coupled to the other electronic device using a variety of configurations including, for example, a ball-grid array (BGA) configuration. In an embodiment, one surface of the semiconductor substrate is coupled to a printed circuit board and an opposing surface of the semiconductor substrate is coupled to another semiconductor substrate.

Figure 21:
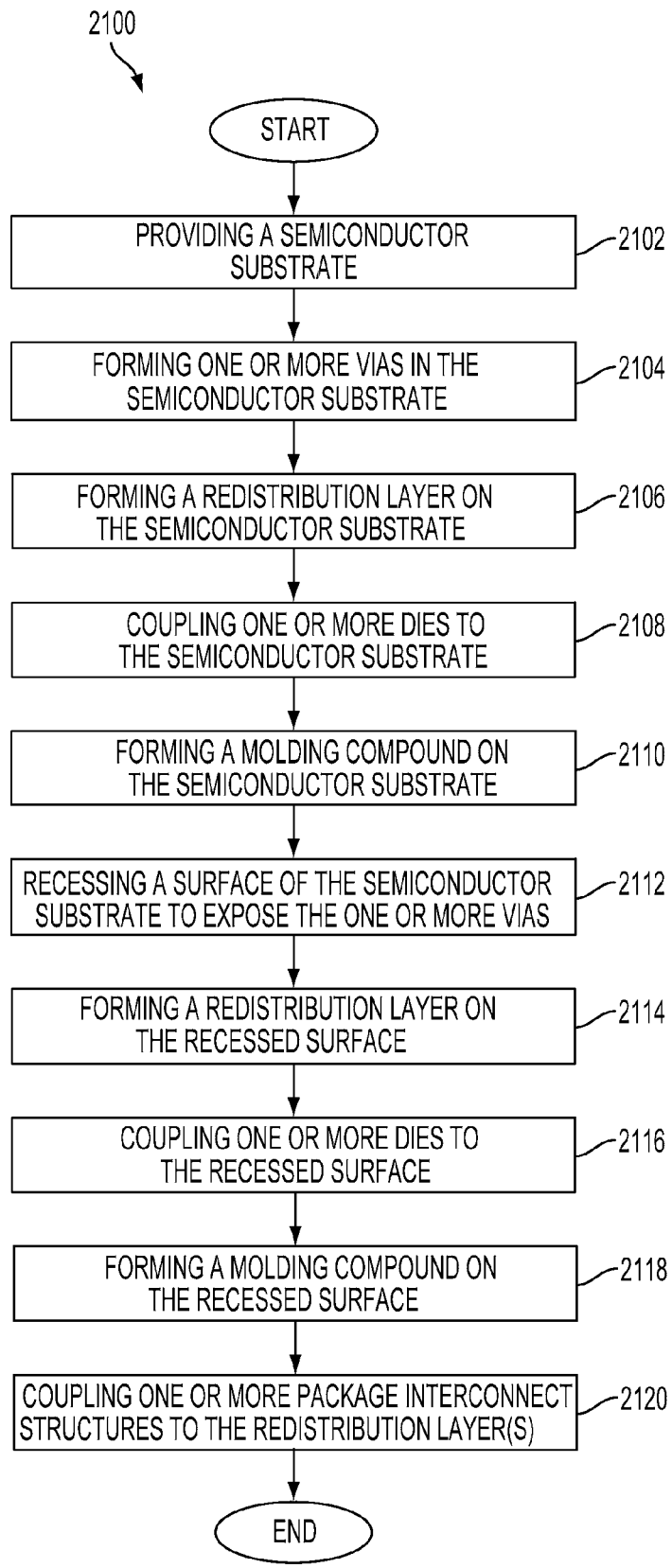
FIG. 21 is a process flow diagram of another method to fabricate a package assembly that includes a semiconductor substrate having a recessed region.

FIG. 21 is a process flow diagram of another method 2100 to fabricate a package assembly that includes a semiconductor substrate having a recessed region. The method 2100 generally describes a technique where the one or more vias are formed prior to coupling one or more dies to the semiconductor substrate. The method 2100 may comport with analogous embodiments described in connection with method 2000.

At 2102, the method 2100 includes providing a semiconductor substrate. The substrate includes a first surface and a second surface that is disposed opposite to the first surface.

At 2104, the method 2100 further includes forming one or more vias in the semiconductor substrate. The one or more vias can be formed in a surface of the semiconductor substrate such that the one or more vias initially pass through only a portion of the semiconductor substrate without reaching an opposite surface of the semiconductor substrate. The one or more vias can be formed using similar techniques as described in connection with method 2000.

At 2106, the method 2100 further includes forming a redistribution layer on the semiconductor substrate. The redistribution layer can be formed using similar techniques as described in connection with method 2000.

At 2108, the method 2100 further includes coupling one or more dies to the semiconductor substrate. The one or more dies are electrically coupled to the redistribution layer. The one or more dies can be coupled to the substrate using similar techniques as described in connection with method 2000.

At 2110, the method 2100 further includes forming a molding compound on the semiconductor substrate. The molding compound can be formed using similar techniques as described in connection with method 2000.

At 2112, the method 2100 further includes recessing a surface of the semiconductor substrate to expose the one or more vias. The surface that is recessed is the surface that is opposite to the surface in which the one or more vias are formed. That is, if the one or more vias are formed in the first surface of the semiconductor substrate, the second surface is recessed, and vice versa. The semiconductor substrate can be recessed by a grinding process or an etch process to provide a recessed region having a thickness between about 10 microns and about 500 microns. Other recessing techniques and thicknesses can be used in other embodiments. According to various embodiments, the molding compound is used as a mechanical carrier to support the semiconductor substrate during the recessing to expose the one or more vias.

The method 2100 can further include forming a redistribution layer on the recessed surface at 2114, coupling one or more dies to the recessed surface at 2116, forming a molding compound on the recessed surface at 2118, and coupling one or more package interconnect structures to the redistribution layer(s) at 2120. Such actions may comport with analogous actions already described in connection with method 2000.

Figure 22:
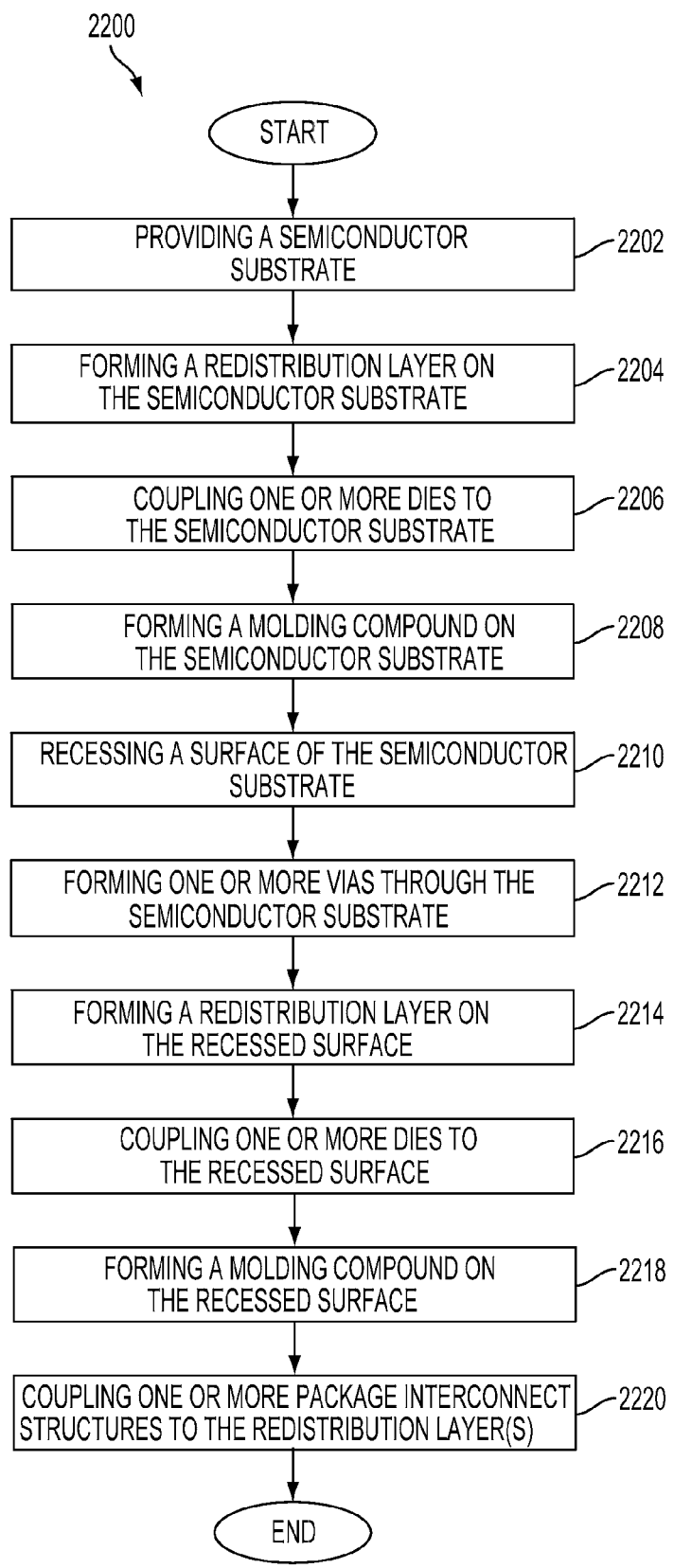
FIG. 22 is a process flow diagram of yet another method to fabricate a package assembly that includes a semiconductor substrate having a recessed region.

FIG. 22 is a process flow diagram of yet another method 2200 to fabricate a package assembly that includes a semiconductor substrate having a recessed region. The method 2200 generally describes a technique where the one or more vias are formed subsequent to coupling one or more dies to the semiconductor substrate. The method 2200 may comport with analogous embodiments described in connection with method 2000.

At 2202, the method 2200 includes providing a semiconductor substrate. The substrate includes a first surface and a second surface that is disposed opposite to the first surface.

At 2204, the method 220 further includes forming a redistribution layer on the semiconductor substrate. The redistribution layer can be formed using similar techniques as described in connection with method 2000.

At 2206, the method 2200 further includes coupling one or more dies to the semiconductor substrate. The one or more dies can be coupled to the substrate using similar techniques as described in connection with method 2000.

At 2208, the method 2200 further includes forming a molding compound on the semiconductor substrate. The molding compound can be formed using similar techniques as described in connection with method 2000.

At 2210, the method 2200 further includes recessing a surface of the semiconductor substrate. A surface that is disposed opposite to the surface upon which the one or more dies are coupled is recessed. That is, if the one or more dies are coupled to the first surface of the semiconductor substrate, then the second surface is recessed. The semiconductor substrate can be recessed by a grinding process or an etch process to provide a recessed region having a thickness between about 10 microns and about 500 microns. Such thicknesses may facilitate formation of one or more vias that pass completely through the semiconductor substrate. Other recessing techniques and thicknesses can be used in other embodiments. According to various embodiments, the molding compound is used as a mechanical carrier to support the semiconductor substrate during the recessing.

At 2212, the method 2200 further includes forming one or more vias through the semiconductor substrate. The one or more vias can be formed using similar techniques as described in connection with method 2000.

The method 2200 can further include forming a redistribution layer on the recessed surface at 2214, coupling one or more dies to the recessed surface at 2216, forming a molding compound on the recessed surface at 2218, and coupling one or more package interconnect structures to the redistribution layer(s) at 2220. Such actions may comport with analogous actions already described in connection with method 2000.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
a semiconductor substrate having
a first surface,
a second surface that is disposed opposite to the first surface, wherein (i) at least a first portion of the first surface is recessed relative to a second portion of the first surface to form a first recessed region of the semiconductor substrate and (ii) a second recessed region is formed from at least a portion of the second surface of the semiconductor substrate, and
one or more vias formed in the first recessed region of the semiconductor substrate, the one or more vias to provide an electrical or thermal pathway between the first surface and the second surface of the semiconductor substrate;
a first die coupled to the semiconductor substrate, the first die being electrically coupled to the one or more vias formed in the first recessed region of the semiconductor substrate;
a first redistribution layer formed on the first surface of the semiconductor substrate, wherein (i) the first die is coupled to the first surface of the semiconductor substrate via the first redistribution layer, and (ii) the first die is coupled to the first redistribution layer via one or more first bumps;
a second redistribution layer formed on the second surface of the semiconductor substrate; and
a second die (i) coupled to the second surface of the semiconductor substrate via the second redistribution layer, and (ii) coupled to the second redistribution layer via one or more second bumps.

2. The apparatus of claim 1, wherein the first recessed region of the semiconductor substrate has a first thickness that is smaller than a second thickness of a region of the semiconductor substrate that is external to the first recessed region.

3. The apparatus of claim 2, wherein the second die is coupled to the region of the semiconductor substrate having the second thickness.

4. The apparatus of claim 2, wherein the first die is disposed on the region of the semiconductor substrate having the second thickness.

5. The apparatus of claim 2, wherein the one or more vias comprise one or more first vias, and wherein the apparatus further comprises:
one or more second vias formed in the region of the semiconductor substrate having the second thickness, wherein the one or more second vias are disposed on only one of (i) the first surface or (ii) the second surface of the semiconductor substrate.

6. The apparatus of claim 1, wherein the first redistribution layer is electrically coupled to the one or more vias to route electrical signals of the first die.

7. The apparatus of claim 6, further comprising:
one or more package interconnect structures (i) coupled to the first surface of the semiconductor substrate and (ii) electrically coupled to the first redistribution layer, the one or more package interconnect structures to further route the electrical signals of the first die.

8. The apparatus of claim 7, wherein the one or more package interconnect structures comprise at least one of solder balls or metal posts.

9. The apparatus of claim 7, further comprising:
a printed circuit board coupled to the semiconductor substrate using the one or more package interconnect structures.

10. The apparatus of claim 7, wherein:
the one or more package interconnect structures are a first set of package interconnect structures; and
the apparatus further comprises:
a second set of package interconnect structures (i) coupled to the second surface of the semiconductor substrate and (ii) electrically coupled to the second redistribution layer, the second set of package interconnect structures to further route the electrical signals of at least one of the first die or the second die.

11. The apparatus of claim 1, wherein the second die is coupled to (i) the first recessed region and (ii) the second surface of the semiconductor substrate in a flip-chip configuration, the second die being electrically coupled to the one or more vias.

12. The apparatus of claim 1, wherein the first die is coupled to the first surface of the semiconductor substrate in a flip-chip configuration.

13. The apparatus of claim 1, wherein the first die is coupled to the first recessed region.

14. The apparatus of claim 1, wherein:
the semiconductor substrate comprises silicon;
the first die, the second die, or both comprise silicon; and
the one or more vias comprise through-silicon vias (TSVs).

15. The apparatus of claim 1, wherein the semiconductor substrate is recessed such that the first recessed region has a thickness between 10 microns and 500 microns.

16. The apparatus of claim 1, wherein:
an active side of the second die is coupled opposite to an active side of the first die; and
the active side of the first die is coupled to the first redistribution layer via the one or more first bumps on the first redistribution layer, and the active side of the second die is coupled to the second redistribution layer via the one or more second bumps on the second redistribution layer.

17. The apparatus of claim 1, wherein the second die is disposed in the second recessed region.

18. The apparatus of claim 17, wherein:
the one or more vias are one or more first vias; and
the second recessed region includes one or more second vias formed in the second recessed region, the one or more second vias to provide an electrical or thermal pathway between the first surface and the second surface of the semiconductor substrate.

19. The apparatus of claim 1, further comprising:
a molding compound disposed on at least one of (i) the first surface or (ii) the second surface of the semiconductor substrate, the molding compound being further disposed to substantially encapsulate at least one of the first die or the second die.

20. An apparatus comprising:
a semiconductor substrate having
a first surface,
a second surface that is disposed opposite to the first surface, wherein a first portion of the first surface is recessed to form a first recessed region of the semiconductor substrate and a second portion of the second surface is recessed to form a second recessed region of the semiconductor substrate, and
one or more vias formed in the first recessed region of the semiconductor substrate, the one or more vias to provide an electrical or thermal pathway between the first surface and the second surface of the semiconductor substrate;

a die coupled to the semiconductor substrate, wherein
  the die is coupled to the first surface of the semiconductor substrate,
  the die is coupled to the first recessed region,
  the die is electrically coupled to the one or more vias formed in the first recessed region of the semiconductor substrate, and
  the die is coupled to the semiconductor substrate in a flip-chip configuration;
a molding compound disposed (i) in direct contact with at least a portion of a surface of the die and (ii) on at least one of the first surface or the second surface of the semiconductor substrate;
a first redistribution layer (i) formed on the second surface of the semiconductor substrate and (ii) electrically coupled to the one or more vias to route electrical signals of the die;
one or more first package interconnect structures (i) coupled to the second surface of the semiconductor substrate and (ii) electrically coupled to the first redistribution layer to further route the electrical signals of the die;
a second redistribution layer (i) formed on the first surface of the semiconductor substrate and (ii) electrically coupled to the one or more vias to further route the electrical signals of the die; and
one or more second package interconnect structures (i) coupled to the first surface of the semiconductor substrate and (ii) electrically coupled to the second redistribution layer to further route the electrical signals of the die.

21. An apparatus comprising:
a semiconductor substrate having
  a first surface,
  a second surface that is disposed opposite to the first surface, wherein (i) at least a first portion of the first surface is recessed relative to a second portion of the first surface to form a first recessed region of the semiconductor substrate, (ii) at least a third portion of the first surface of the semiconductor substrate is recessed relative to the second portion of the first surface of the semiconductor substrate to form a second recessed region of the semiconductor substrate, and (iii) the first recessed region has a first thickness that is smaller than a second thickness of a region of the semiconductor substrate that is external to (A) the first recessed region and (B) the second recessed region, and wherein the first recessed region of the semiconductor substrate is separate from the second recessed region of the semiconductor substrate, and
  one or more vias formed in the first recessed region of the semiconductor substrate, the one or more vias to provide an electrical or thermal pathway between the first surface and the second surface of the semiconductor substrate;
a die coupled to the region of the semiconductor substrate having the second thickness, wherein
  the die is electrically coupled to the one or more vias formed in the first recessed region of the semiconductor substrate;
a redistribution layer (i) formed on the second surface of the semiconductor substrate and (ii) electrically coupled to the one or more vias to route electrical signals of the die; and
one or more package interconnect structures (i) coupled to the second surface of the semiconductor substrate and (ii) electrically coupled to the redistribution layer to further route the electrical signals of the die.

22. The apparatus of claim 21, further comprising a second semiconductor substrate coupled to the first semiconductor substrate using the one or more package interconnect structures and wherein:
  the one or more vias formed in the first recessed region of the first semiconductor substrate comprise one or more first vias, and
  one or more second vias are formed in the second semiconductor substrate.

23. The apparatus of claim 21, wherein the die is coupled to the first surface in the region of the semiconductor substrate that is external to the (i) first recessed region and (ii) second recessed region.

24. The apparatus of claim 21, wherein the one or more package interconnect structures are first one or more package interconnect structures, and wherein the apparatus further comprises:
  second one or more package interconnect structures coupled to the first surface of the semiconductor substrate in the first recessed region of the semiconductor substrate, wherein the second one or more package interconnect structures are configured to electrically connect the apparatus to an external component.

25. The apparatus of claim 21, wherein:
  the region of the semiconductor substrate, which is external to the first recessed region and the second recessed region, is a non-recessed region of the semiconductor substrate; and
  the non-recessed region of the semiconductor substrate separates the first recessed region of the semiconductor substrate from the second recessed region of the semiconductor substrate.

26. An apparatus comprising:
a semiconductor substrate having
  a first surface,
  a second surface that is disposed opposite to the first surface, wherein (i) at least a first portion of the first surface is recessed relative to a second portion of the first surface to form a recessed region of the semiconductor substrate and (ii) the recessed region has a first thickness that is smaller than a second thickness of a region of the semiconductor substrate that is external to the recessed region, and
  one or more vias formed in the recessed region of the semiconductor substrate, the one or more vias to provide an electrical or thermal pathway between the first surface and the second surface of the semiconductor substrate;
a die coupled to the region of the semiconductor substrate having the second thickness, wherein
  the die is electrically coupled to the one or more vias formed in the first recessed region of the semiconductor substrate;
a redistribution layer (i) formed on the second surface of the semiconductor substrate and (ii) electrically coupled to the one or more vias to route electrical signals of the die; and
one or more package interconnect structures (i) coupled to the second surface of the semiconductor substrate and (ii) electrically coupled to the redistribution layer to further route the electrical signals of the die,
wherein the die is coupled to the region of the semiconductor substrate having the second thickness such that the die is physically attached to the region of the semiconductor substrate having the second thickness, and
the die is not physically attached to the recessed region of the semiconductor substrate.

* * * * *